(12) United States Patent
Park

(10) Patent No.: US 6,900,090 B2
(45) Date of Patent: May 31, 2005

(54) SEMICONDUCTOR DEVICE HAVING A TRENCH ISOLATION STRUCTURE AND METHOD FOR FABRICATING THE SAME

(75) Inventor: Tai-Su Park, Suwon (KR)

(73) Assignee: Samsung Electronics Co., LTD, Kyungki-Do (KR)

(*) Notice: Subject to any disclaimer, the term of this patent is extended or adjusted under 35 U.S.C. 154(b) by 0 days.

(21) Appl. No.: 10/623,918

(22) Filed: Jul. 21, 2003

(65) Prior Publication Data

US 2004/0018676 A1 Jan. 29, 2004

Related U.S. Application Data

(62) Division of application No. 09/964,906, filed on Sep. 27, 2001, now Pat. No. 6,617,662.

(30) Foreign Application Priority Data

Mar. 23, 2001 (KR) .......................................... 2001-15149

(51) Int. Cl.$^7$ .......................................... H01L 21/8238
(52) U.S. Cl. ........................ 438/221; 438/296; 438/359
(58) Field of Search .................................. 438/221, 296, 438/353, 359

(56) References Cited

U.S. PATENT DOCUMENTS 6,239,476 B1 * 5/2001 Gardner et al. ............. 257/513
2002/0005560 A1 * 1/2002 Lee et al. .................... 257/510

* cited by examiner

Primary Examiner—Eddie Lee
Assistant Examiner—Douglas W. Owens
(74) Attorney, Agent, or Firm—F. Chau & Associates, LLC

(57) ABSTRACT

A device isolation structure in a semiconductor device and a method for fabricating the same are disclosed. A trench is formed in a semiconductor substrate to confine a plurality of active regions, an insulating material is deposited to fill the trench and the insulating material having a portion extending from the trench to above the semiconductor substrate, and a trench oxidation preventive film is formed on the insulating material. The semiconductor device preferably further includes a gate line extending in one direction on the semiconductor substrate having the trench oxidation-preventive film, and a sidewall spacer formed a sidewall of the gate line, wherein the trench oxidation-preventive film is disposed on the insulating material and disposed under the gate line and the sidewall spacer.

15 Claims, 10 Drawing Sheets

SEMICONDUCTOR DEVICE HAVING A TRENCH ISOLATION STRUCTURE AND METHOD FOR FABRICATING THE SAME

CROSS-REFERENCE TO RELATED APPLICATION

This application is a divisional of U.S. application Ser. No. 09/964,906 filed on Sep. 27, 2001, now U.S. Pat. No. 6,617,662 the disclosure of which in its entirety is incorporated by reference herein.

This application claims priority to Korean Patent Application No. 2001-15149, filed on Mar. 23, 2001, the contents of which are herein incorporated by reference in their entirety.

BACKGROUND OF THE INVENTION

1. Field of the Invention

The present invention generally relates to a semiconductor device and a method for fabricating the same, and more specifically to a trench isolation structure of a semiconductor device and a method for fabricating the same.

2. Description of the Related Art

As integration density of semiconductor integrated circuits increases, circuit components such as transistors are formed closer to each other and reliability of the circuits can be reduced unless effective isolation techniques for separating devices such as MOS transistors are employed. A trench isolation technique which can form an isolation region having a narrow width is widely used in the manufacture of a highly integrated semiconductor device.

However, the trench isolation method inherently suffers from problems such as substrate damage caused from the trench etching process, oxidation of the semiconductor substrate in sidewalls of the trench during a subsequent oxidation process, or another physical-thermal stress.

To suppress the stress arising from the oxidation process, a technique has been proposed in which a thermal oxidation film is formed in inner walls of trenches after forming a trench in a semiconductor device, and then a nitride liner is formed on the thermal oxidation film. U.S. Pat. No. 5,447,884 discloses the aforementioned method performing a trench isolation in which oxidation of the inside of the trench is prevented by forming a nitride liner on a thermal oxidation film.

However, the use of the nitride liner causes other problems. Electrical charges can be trapped in the inside of the nitride liner, or into a boundary region between the nitride liner and the thermal oxidation film in the trench, so that charges electrically opposite to the trapped charges are coupled at sidewalls of the trenches. In PMOS, for instance, if the nitride liner traps electrons, holes electrically coupled with the trapped electrons are collected in the trench sidewalls, resulting in a lower threshold voltage. As a result, the transistor (i.e., the PMOS transistor) can be non-intentionally or falsely triggered to turn on at operation voltage lower than a predetermined threshold voltage.

In addition, while removing a pad nitride film composing an etch mask for patterning the trenches, a part of the nitride liner formed in the trench is concurrently etched away with pad nitride film, and thereby recesses, and so-called "dents" are created along the trench sidewalls.

Meanwhile, U.S. Pat. No. 5,940,717, entitled "Recessed Shallow Trench Isolation Structure Nitride Liner and Method for Making Same", filed on Oct. 30, 1998 discloses a method of forming a nitride liner which is recessed in the inside of the trench to reduce the generation of the charge trap at the nitride liner.

FIG. 1 is a cross-sectional view of a trench isolation structure. The structure shown includes a semiconductor substrate 100, a thermal oxide film 112, a pad oxide film 106, a nitride liner 114, and a trench fill insulating material 702. As shown in FIG. 1, the thermal oxide film 112 is disposed inside the trench, and the nitride liner 114 is disposed on the thermal oxidation film 112. However, the nitride liner 114 is recessed to a predetermined depth in the inside of the trench from a top surface of the substrate 100. Namely, the nitride liner 114 is recessed downward along the trench sidewall and below the channel region, thereby preventing charge trapping in the channel region. Further, the trench fill insulating material 702 is formed to completely fill the trench on the thermal oxidation film 112 and the nitride liner 114. The nitride liner 114 serves to prevent a bulk expansion caused by oxidation in the inside of the trench, a stress increment of a silicon substrate, and a defection therefrom. However, since the nitride liner 114 is not formed on an upper part of the trench, an inner wall of upper part of the trench may be oxidized, resulting in failure to obtain the original function of the nitride liner. Thus, a need exists for a semiconductor device having a trench isolation structure for effectively solving the aforementioned problems.

SUMMARY OF THE INVENTION

A semiconductor device is provided which includes: a trench formed in a semiconductor substrate to confine a plurality of active regions; an insulating material deposited to fill the trench and the insulating material having a portion extending from the trench to above the semiconductor substrate; and a trench oxidation preventive film formed on the insulating material.

The semiconductor device preferably further includes: a gate line extending in one direction on the semiconductor substrate having the trench oxidation-preventive film; and a sidewall spacer formed a sidewall of the gate line, wherein the trench oxidation-preventive film is disposed on the insulating material and disposed under the gate line and the sidewall spacer.

According to a preferred embodiment of the invention, the insulating material includes: a first oxide film formed on an upper edge of the active region, and a bottom and a sidewall of the trench; and a second oxide film formed on the first oxide film to completely fill the trench. The first oxide film is a thermal oxide film and the second oxide film is a chemical vapor deposition (CVD) oxide film.

A method for forming a trench isolation is also provided which includes the steps of: forming a planarization stop layer on a semiconductor substrate on which a pad oxide layer is formed; forming a trench in the semiconductor substrate by etching sequentially a part of the planarization stop layer, a part of the pad oxide film, and a part of the semiconductor substrate; performing a thermal oxidation process for the semiconductor substrate in which the trench is formed; filling the trench with a trench fill insulating material in which the thermal oxidation process is performed; planarizing the trench fill insulating material such that the planarization stop layer is exposed; recessing the trench fill insulating material to under the planarization stop film; and forming a trench oxidation-preventive film on the recessed trench fill insulating material.

According to a preferred embodiment of the invention, the level of the trench oxidation-preventive film is substantially even with an upper surface of the planarization stop film after planarizing. The planarization stop film is made of a silicon layer, and the trench oxidation-preventive film is made of a silicon nitride film.

A method for forming a trench isolation is also provided which includes the steps of: forming a planarization stop layer on a semiconductor substrate on which a pad oxide film is formed; forming a trench by etching sequentially a part of the planarization stop film, a part of the pad oxidation film, and a part of the semiconductor substrate; forming a thermal oxide film on a bottom and a sidewall of the trench, and on a sidewall and a top surface of the planarization stop film; filling the trench with a trench fill insulating material on the thermal oxide film to completely fill the trench; planarization the trench fill insulating material such that the planarization stop film is exposed; recessing the planarized trench fill insulating material under the planarization stop film; forming a trench oxidation-preventive film on the recessed trench fill insulating material; and removing the planarization stop film and the pad oxide film.

According to a preferred embodiment of the present invention, the planarization stop film is made of a silicon film and the trench oxidation-preventive film is made of a silicon nitride film. The step of filling the trench is performed in a same facility for the step of the forming the thermal oxide film. The step of recessing the planarized trench fill insulating material exposes a sidewall of the planarization stop film, and recesses substantially to an interface between the planarization stop film and the pad oxidation film.

According to a preferred embodiment of the present invention, the step of forming the oxidation-preventive film preferably includes the steps of: forming an oxidation-preventive material film on the planarization stop film and the recessed trench fill insulating material; and planarizing the oxidation-preventive material film such that the planarization stop film is exposed.

The method preferably further includes the steps of: forming a gate oxidation film on the semiconductor substrate on which the planarization stop film and the pad oxide film are removed; forming a gate electrode material on the gate oxidation film and the trench oxidation-preventive film; forming a gate line extending to one direction by patterning the gate electrode material; forming a sidewall spacer insulating film over an entire surface of the consequence where the gate line is formed; and forming an insulating spacer on a sidewall of the gate line by etching the sidewall spacer insulating film, wherein the trench oxidation-preventive film on both sides of the gate line is etched concurrently with the sidewall spacer insulating film, leaving the oxidation-preventive film only on the trench under the gate line and the sidewall spacer insulating film.

According to a preferred embodiment of the present invention, the thermal oxidation film is formed on the sidewall and the top surface of the planarization stop film thicker than that on the bottom and the sidewall of the trench.

BRIEF DESCRIPTION OF THE DRAWINGS

The features and advantages of the present invention will become more apparent from the following detailed description when taken in conjunction with the accompanying drawings in which.

DETAILED DESCRIPTION OF PREFERRED EMBODIMENTS

Figure 1:
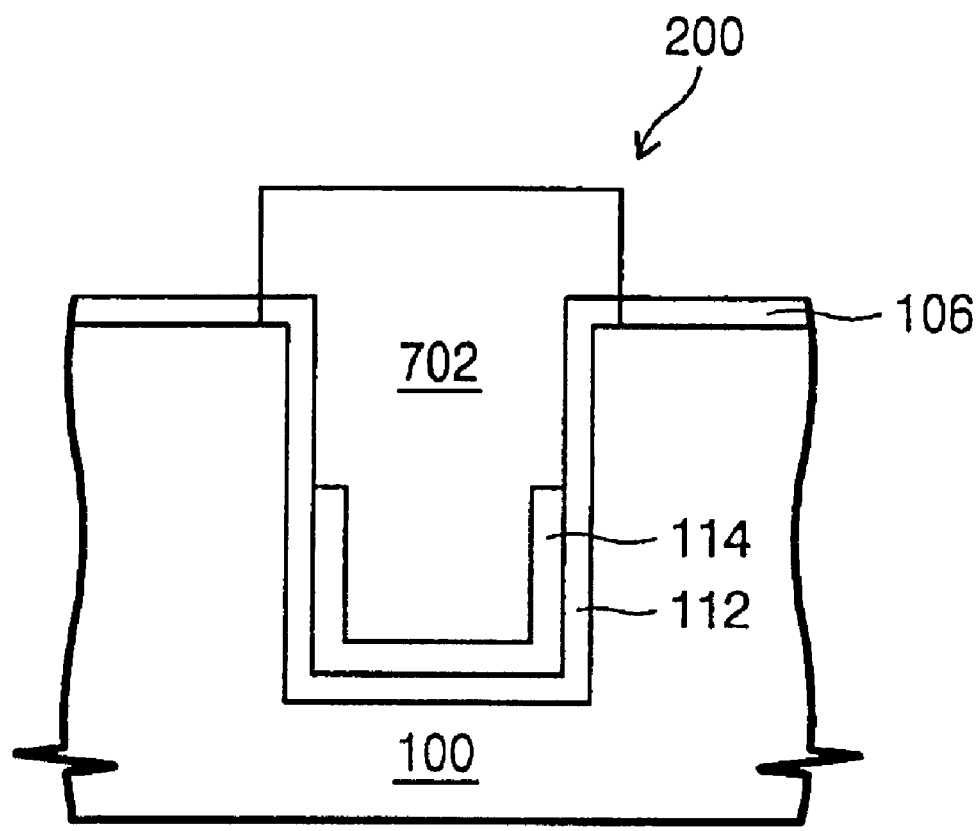
FIG. 1 is a cross-sectional view of structure illustrating conventional method for fabricating a trench isolation structure.

Hereinafter, the present invention will be described in detail with reference to the accompany drawings. It should be noted that like reference numerals are used for designation of like or equivalent parts or portion for simplicity of illustration and explanation. Also, in the following description, specifications will be made to provide a thorough understanding about the present invention. It is apparent to on skilled in the art that the present invention can be achieved without the specifications. There will be omission of detailed description about well known functions and structures to clarify key points of the present invention.

A method for forming the trench isolation structure is in detail explained hereinafter, with reference to FIGS. 2 through 10. FIGS. 2 through 10 illustrate sequential process steps according to a preferred embodiment of the present invention.

Figure 2:
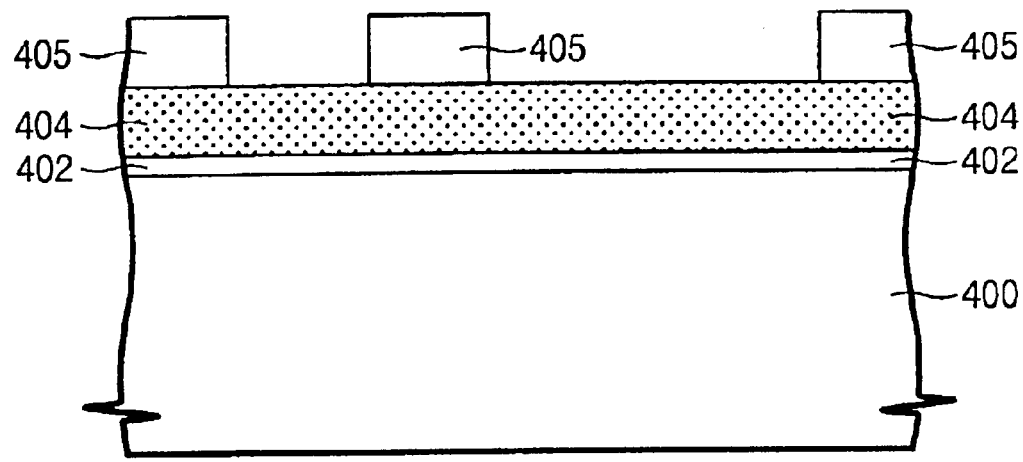
FIGS. 2 through 10 illustrate sequential process steps for fabricating a trench isolation structure according to a preferred embodiment of the present invention.

Referring to FIG. 2, a pad oxide film 402 and a planarization stop film 404 are sequentially formed on a semiconductor substrate 400. The planarization stop film 404 is made of silicon material, and it is preferably formed of polycrystalline silicon (poly-silicon). As an alternative to the poly-silicon film, amorphous silicon, and any material having an etch selectivity to a silicon nitride film can be used to form a trench oxidation-preventive film. The planarization stop film 404 is formed with a thickness of about 500 Å to about 1500 Å, preferably a thickness of about 1000 Å. Then, a trench etch mask 405 defining an active region is formed on the planarization stop film 404. A region being covered with the trench etch mask 405 becomes an active region of the semiconductor device, and the other region not being covered with the trench etch mask 405 becomes a device isolation region of the semiconductor device.

Figure 3:
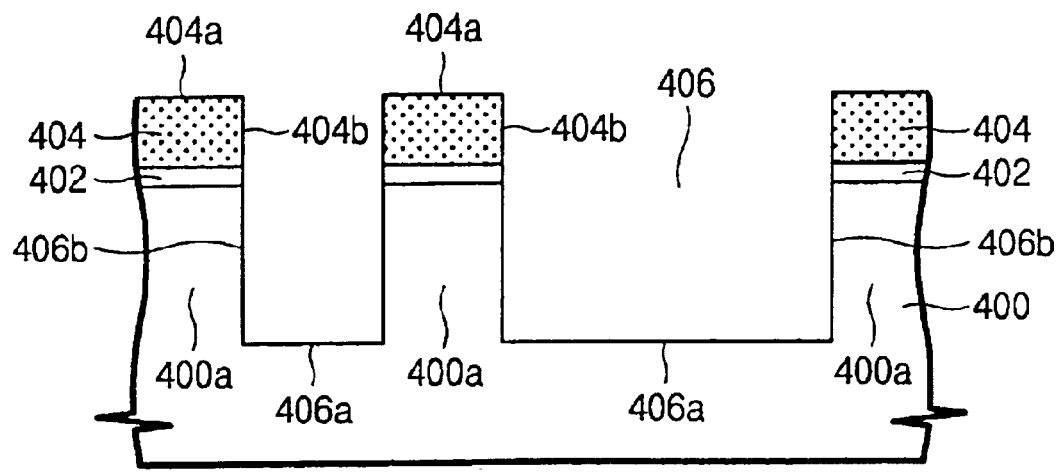

Referring to FIG. 3, a trench 406 is formed by sequential etching the planarization stop film 404, the pad oxidation film 402, and the semiconductor substrate 400 using the trench etch mask 405 as a mask. Then, the trench etch mask 405 is removed. Here, a top surface and a side wall of the planarization stop layer 404 are defined as 404a and 404b, respectively. And a bottom and a sidewall of the trench 406 are defined as 406a and 406b, respectively.

Figure 4:
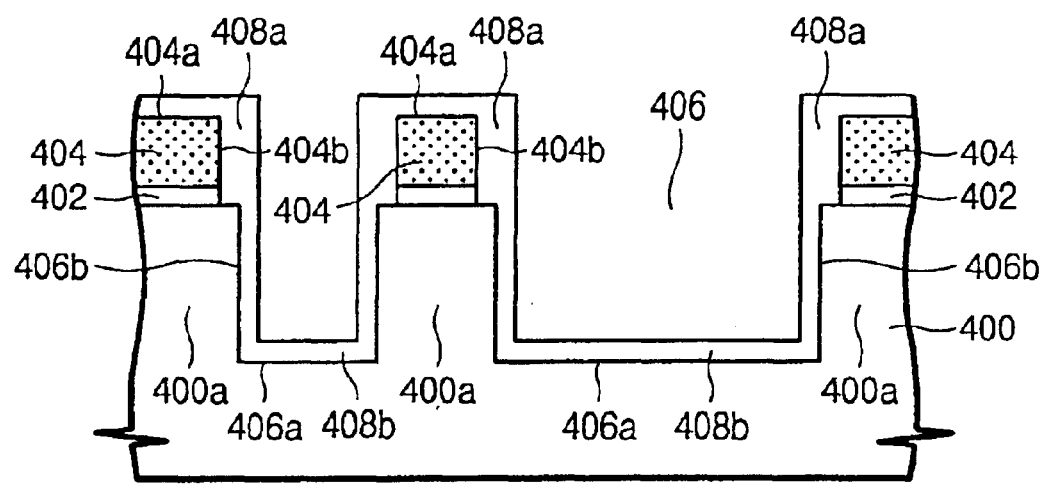

Referring to FIG. 4, a thermal oxidation process is performed on the exposed surface and for recovering an etch damage during forming the trench 406. Then, an thermal oxidation film 408 (408a and 408b) is formed on the bottom 406a of the trench 406, the sidewall 406b of the trench 406, the side wall of the pad oxide film 402 and the planarization stop film 404, and top surface of the planarization stop film 404.

At this time, if a silicon film is used for the planarization stop film 404, a thermal oxidation film 408a is also formed on the sidewall 404b and the top surface 404a of the planarization stop film 404. Further, it is possible that the thermal oxidation film 408a is formed much thicker on the planarization stop film 404 than on the semiconductor substrate 400 due to a difference in the degree of thermal oxidation in the planarization stop film 404 and the semiconductor substrate 400. As a result, the planarization stop film 404 is retracted as shown in FIG. 4.

Figure 5:
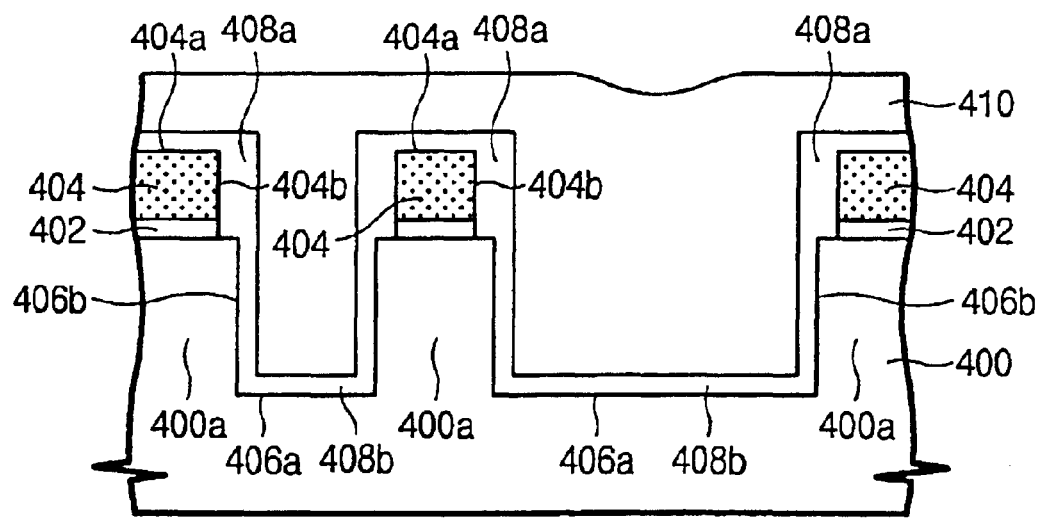

Referring to FIG. 5, unlike the conventional art in which a nitride liner serving as a trench oxidation-preventive film is formed after the thermal oxidation process, in a preferred embodiment of the present invention, a trench fill insulating material 410 is formed to completely fill the trench 406 directly after forming the thermal oxide films 408a and 408b. In other words, the trench fill insulating material 410 is directly contacted with the thermal oxide films 408a and 408b. Thus, a trench filling-facility of the trench fill insulating material 410 is improved, comparing with the conventional art in which the nitride liner is formed inside the trench on the thermal oxide film. The trench fill insulating material 410 is preferably formed by chemical vapor deposition (CVD) oxidation film.

Figure 6:
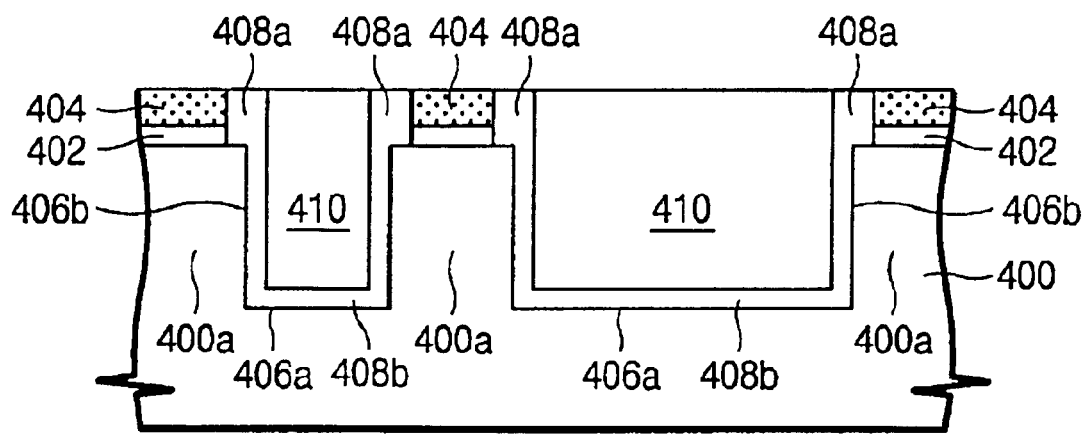

Referring to FIG. 6, to planarize the semiconductor device, a planarization process for the trench fill insulating material 410 is performed by using the planarization stop film 404 as a planarization stop layer. The thermal oxidation film 408a on a top surface of the planarization stop film 404 is concurrently planarized. And also the top surface of the planarization stop film 404 is etched in part during the planarization process until having a thickness of about 500 Å.

Figure 7:
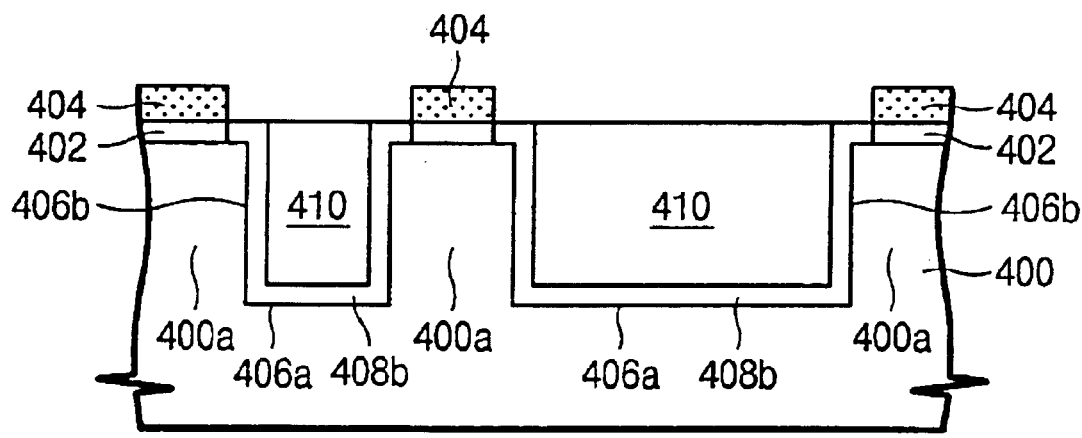

Next, referring to FIG. 7, the trench fill insulating material 410 is etched and recessed under the planarization stop film 404 in a predetermined depth, preferably by using an etchant such as HF (hydrofluoric acid). It is preferable that the trench fill insulating material 410 is recessed to an interface between the planarization stop film 404 and the pad oxide film 402, i.e. to a top surface of the pad oxidation film 402. Here, a part of the thermal oxide film 408a formed on the sidewall 404b of the planarization stop film is concurrently etched. According to a preferred embodiment, the trench fill insulating material 410 is recessed to a depth of between about 200 Å to about 1000 Å, preferably to a thickness of about 500 Å. This depth affects the thickness of a trench oxidation-preventive film formed by a sequence process or a planarization process.

Figure 8A:
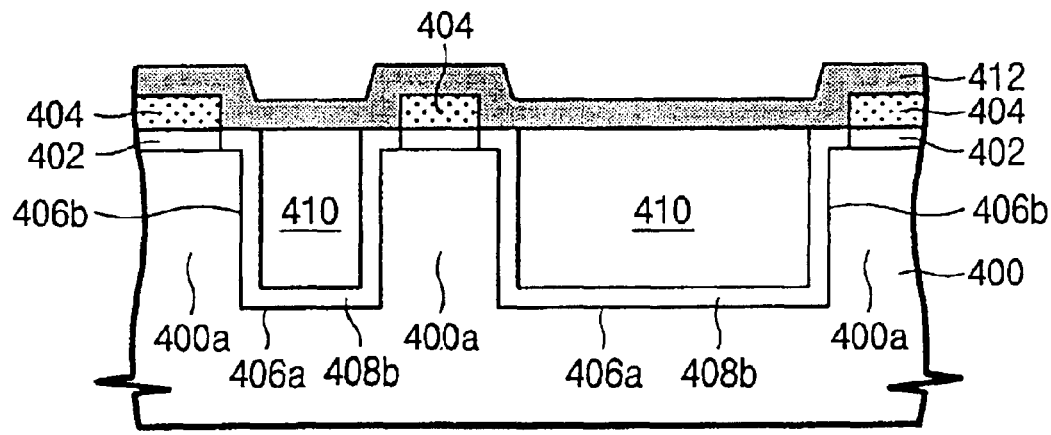

Referring to FIG. 8A, a trench oxidation-preventive film 412 is formed after recessing the trench fill insulating material 410 and the thermal oxide film 408a. The oxidation-preventive film 412 is preferably formed with a silicon nitride film. The thickness of the trench oxidation-preventive film 412 is between about 50 Å to about 500 Å, preferably at a thickness of about 200 Å.

Figure 8B:
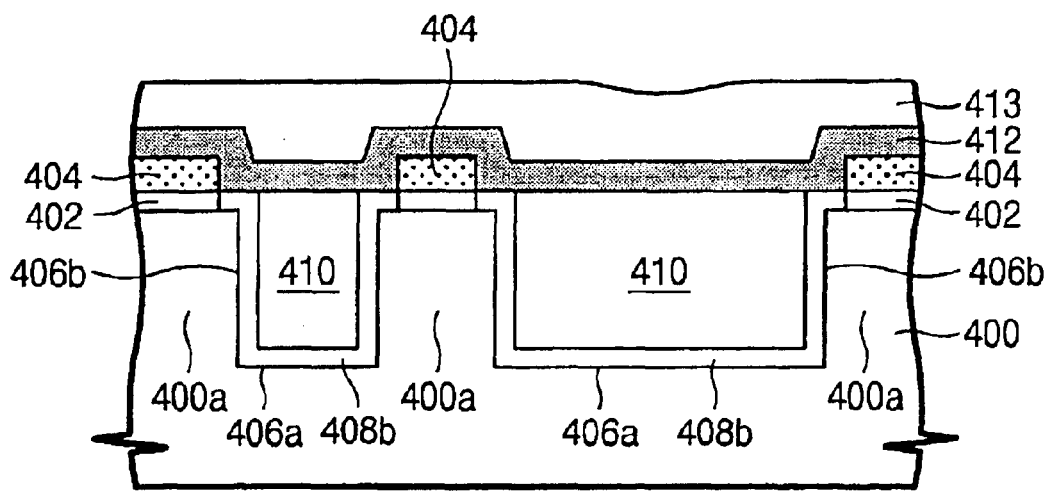

Meanwhile, as shown in FIG. 8B, a buffer oxidation film 413 may be formed on the trench oxidation-preventive film 412 to ensure a processing margin in the planarization process for the trench oxidation-preventive film is 412.

Figure 9A:
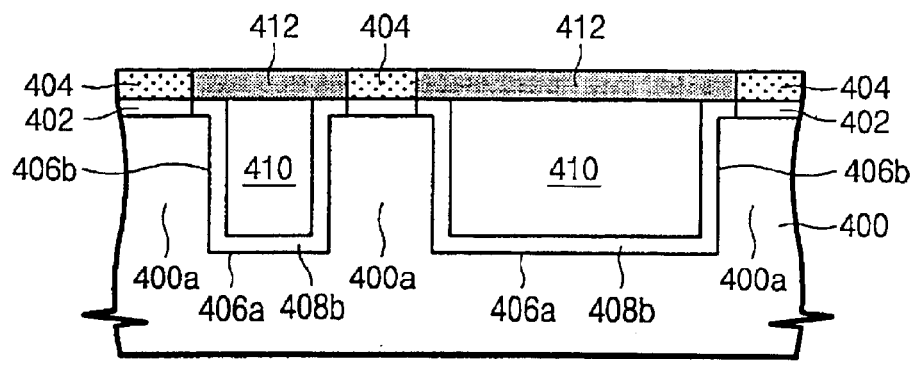
Figure 9B:
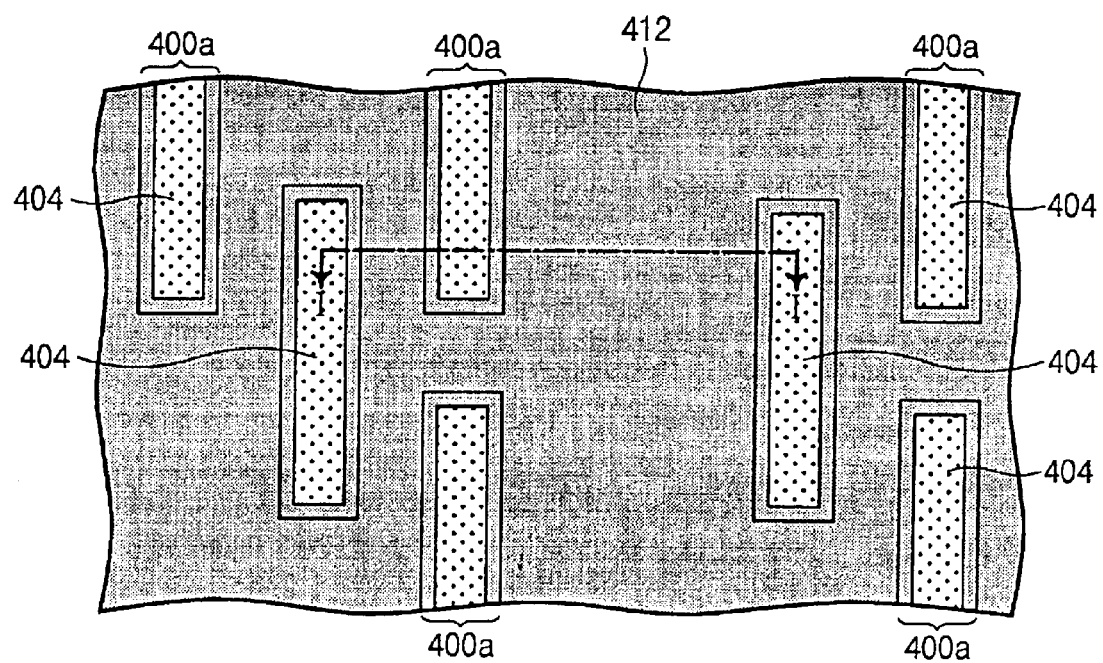

As shown in FIG. 9A, a planarization process for the trench oxidation-preventive film 412 is performed until the planarization stop film 404 is exposed. As a result, the trench oxidation-preventive film 412 is formed over an entire surface (i.e., the trench fill insulating material) of the semiconductor substrate except the active region 400a, as shown in a plan view of FIG. 9B corresponding to FIG. 9A. And as shown in FIG. 9B, an edge portion of the active region 400a is also covered with the trench oxidation-preventive film 412. Accordingly, in a subsequent thermal oxidation process, the trench oxidation-preventive film 412 formed on the trench fill insulating material 410 to cover the trench prevents the trench 410 from being oxidized.

Figure 10A:
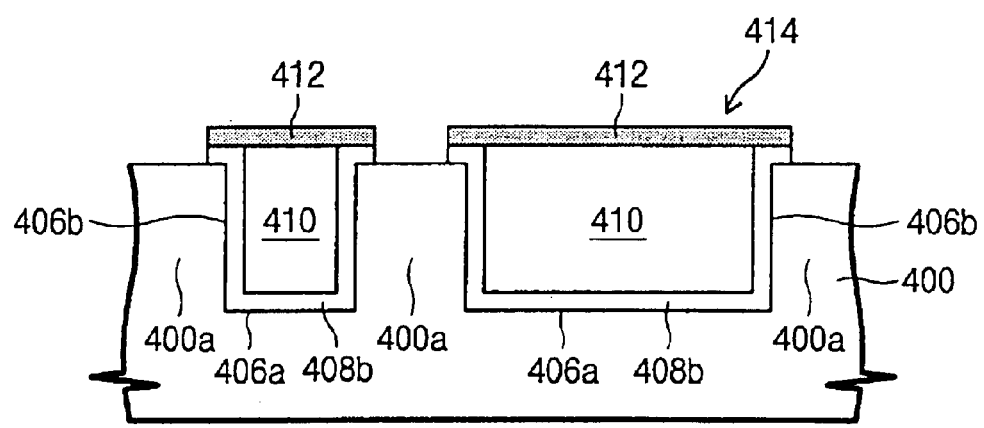
Figure 10B:
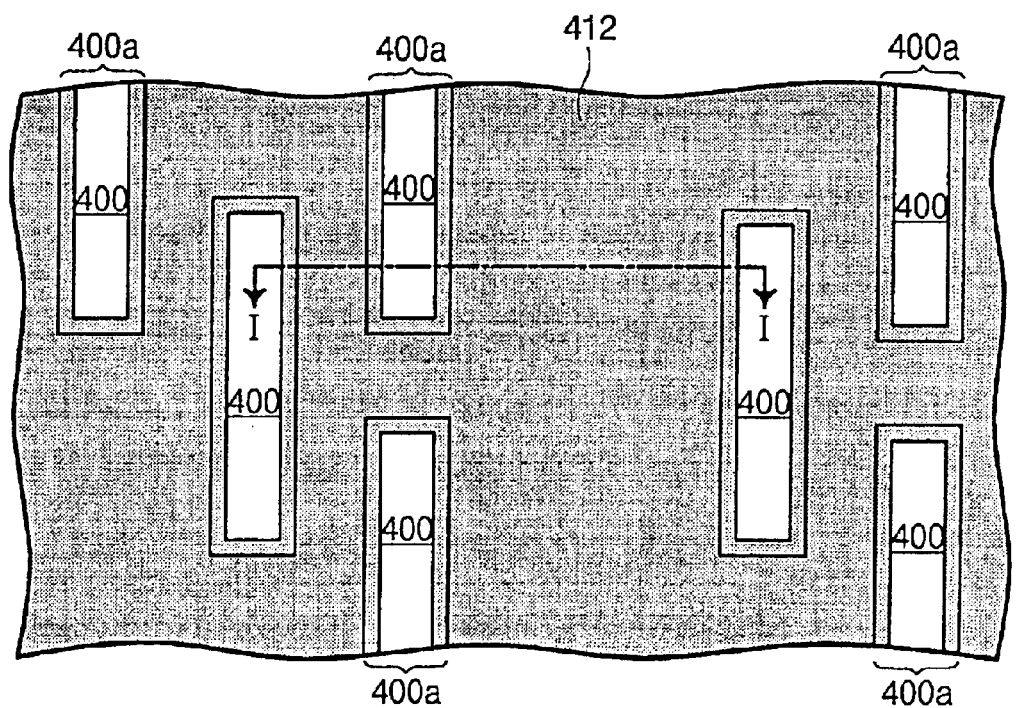

Referring to FIGS. 10A and 10B, after performing the planarization process for the trench oxidation-preventive film 412, by eliminating the exposed planarization stop film 404 and the pad oxide film 402, and thereby exposing the active region 400a, the trench isolation structure 414 is fabricated.

According to a preferred embodiment of the present invention, by using silicon film or the like as the planarization stop film instead of nitride film, a dent phenomenon generated in the nitride liner of the conventional art is prevented.

In the trench isolation structure of a preferred embodiment of the present invention, with reference to FIGS. 10A and 10B, the trench oxidation-preventive film 412 is not formed inside the trench 410, but formed on the trench isolation structure to cover the trench 410, i.e., on the trench fill insulating material 410. Meanwhile, in the thermal oxidation process to recover damage caused by etching the semiconductor substrate 400 during formation of the trench 410, the silicon film as the planarization stop film 404 is thermally oxidized much more than the semiconductor substrate 400 composing the inside of the trench 410. Accordingly, the silicon film as the planarization stop film 404 is contracted toward the active region 400a in a predetermined dimension. As a result, the trench oxidation-preventive film 412 also covers a part of the active region adjacent to the upper edge of the trench 410. Advantageously, the process according to the present invention is more effective in preventing the trench 410 from being oxidized.

Figure 11:
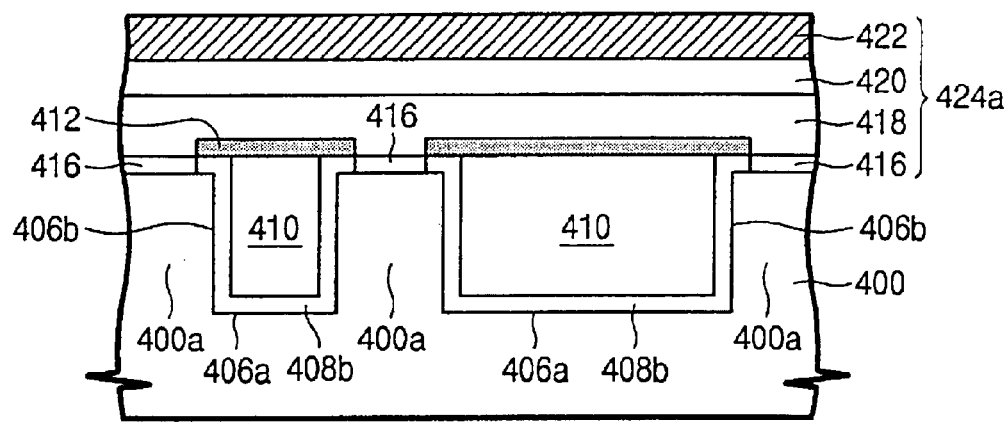
FIGS. 11 through 13 illustrate sequential process steps of fabricating a gate line after completing the trench isolation structure.

A subsequent process of a gate line formation is schematically illustrated in FIGS. 11 through 13. According to a preferred embodiment of the present invention, after a gate line is formed, a part of the trench oxidation-preventive film 412 is concurrently eliminated during forming a sidewall spacer 426. After completing the trench isolation structure 414 (in FIG. 10A), a sacrificial oxidation film (not shown) is formed through a sacrificial oxidation process, and then an ion-implantation for a well, a channel stopping region, and a threshold voltage control is performed to manufacture a general device.

Referring to FIG. 11, after eliminating the sacrificial oxidation film (not shown), a gate oxidation film 416 is formed on the active region 400a as shown in FIG. 11. For a gate electrode material, a doped poly-silicon film 418, a tungsten suicide film 420 are sequentially formed on the trench oxidation-preventive film 412 and the gate oxide film 416, and then a silicon nitride film 422 for a mask is formed on the tungsten silicide film 420.

Figure 12A:
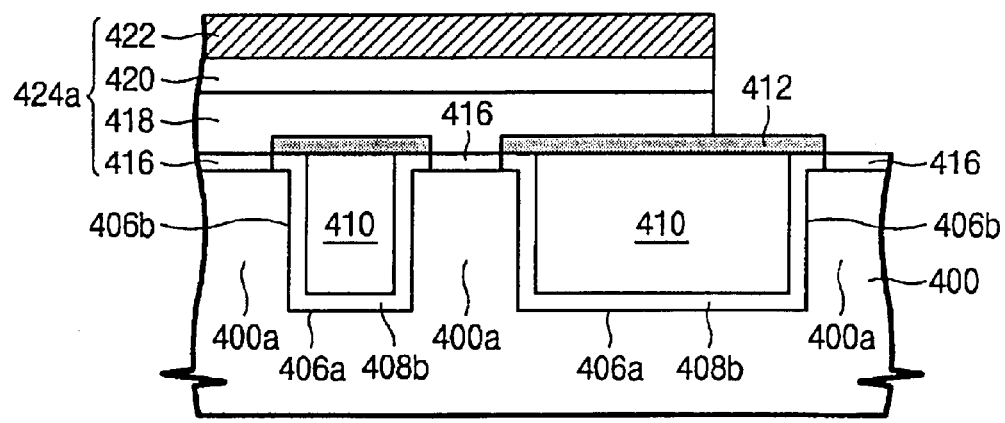
Figure 12B:
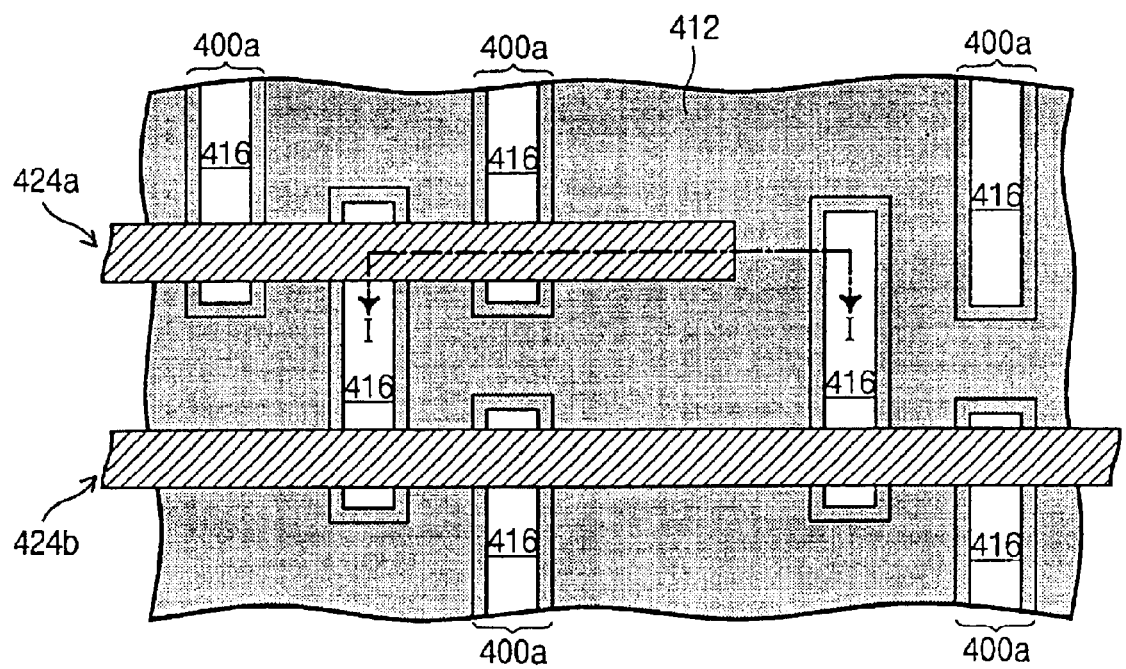

Then, through a usual photo etch process, a gate line 424a is formed as shown in FIG. 12A. The photo etch process is performed by using the trench oxidation-preventive film 412 and the gate oxidation film 416 as etch stopping layers. Accordingly, as shown in a plan view of FIG. 12B corresponding to FIG. 12A, a part of the gate oxidation film 416, a part of the trench oxidation-preventive film 412 are exposed except the region in which the gate lines 424a and 424b are formed. Here, in the photo etch process, the silicon nitride film 422 for the mask may be etched in part.

Figure 13A:
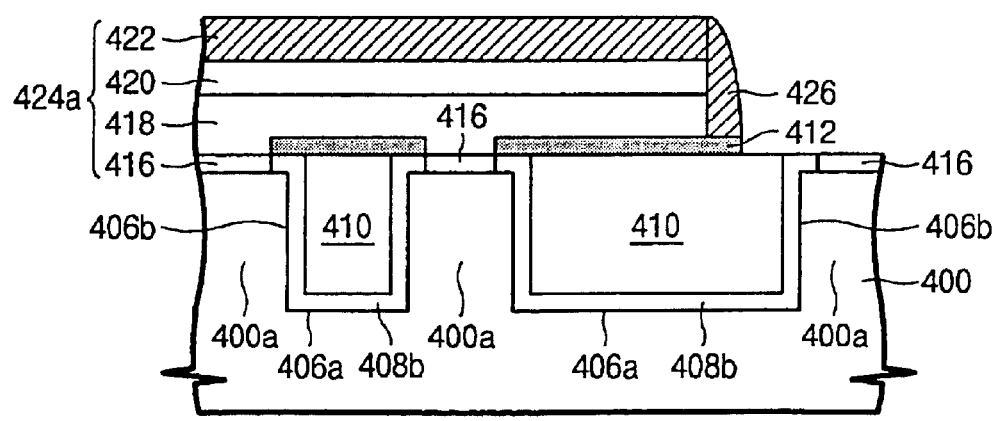
Figure 13B:
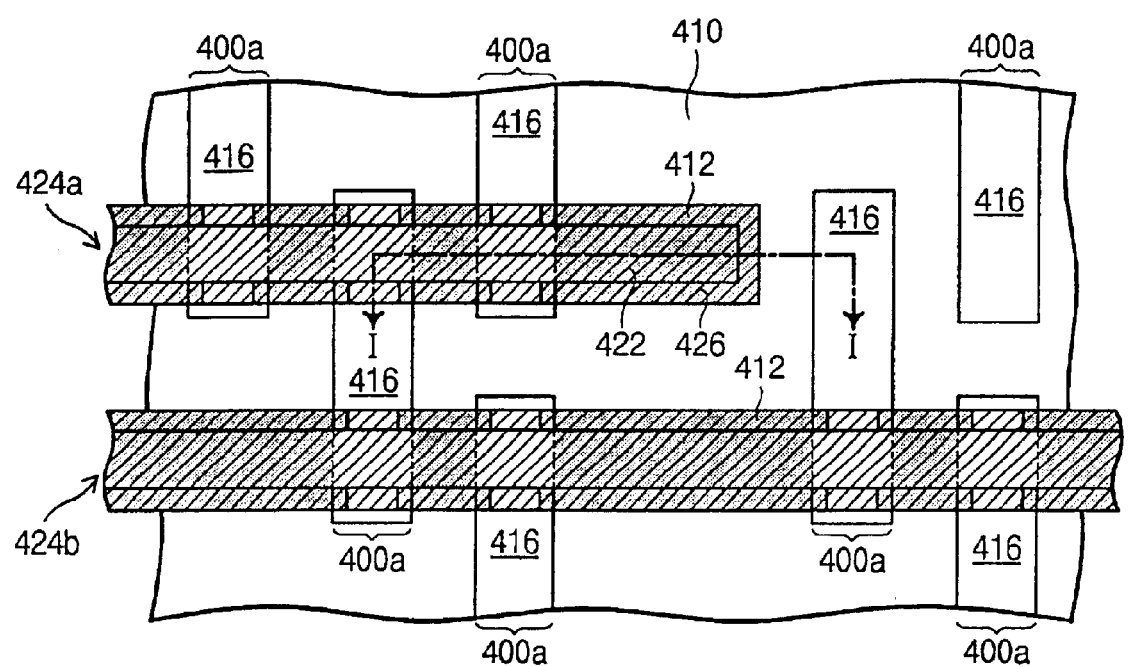

The next process for forming a gate line sidewall spacer is performed by forming a silicon nitride film for a spacer over an entire surface of the semiconductor substrate in which the gate lines 424a and 424b are formed, and then performing an etch process for an entire surface thereof to form a sidewall spacer 426 shown in FIG. 13A. At this time, the trench oxidation-preventive film 412 except a region under the gate lines 424a and 424b is concurrently eliminated, and thereby exposing the trench fill insulating material 410 thereunder. Referring to FIG. 13B corresponding to FIG. 13A, after forming the gate line sidewall spacer, the trench oxidation-preventive film is present only on the trench fill insulating material under the gate line. Thus, it results in diffusing hydrogen with ease in the hydrogen treatment.

According to the trench isolation structure of the present invention, the oxidation-preventive film is formed on the trench isolation insulating material to cover the trench, preventing any charges from being trapped from generating an upper edge of the trench.

In addition, in an etch process for forming a gate sidewall spacer, i.e., in a point in time when an oxidation process is finished, the trench oxidation-preventive film is concurrently eliminated except a region under the gate line, so that hydrogen is easily diffused in a forming gas hydrogen treatment, causing a passivation of the trench sidewall.

Further, since the planarization stop film is made of a silicon film instead of the conventional nitride film, and the nitride liner is formed not in an inner wall of the trench, but on the trench, a dent phenomenon generated in the conventional nitride liner is substantially prevented.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method for forming a trench isolation comprising the steps of:
    forming a planarization stop layer on a semiconductor substrate on which a pad oxide layer is formed;
    forming a trench in the semiconductor substrate by etching sequentially a part of the planarization stop layer, a part of the pad oxide film, and a part of the semiconductor substrate;
    performing a thermal oxidation process to form a thermal oxide film on bottom and sidewall surfaces of the trench and on a sidewall and a top surface of the planarization stop film;
    filling the trench with a trench fill insulating material in which the thermal oxidation process is performed;
    planarizing the trench fill insulating material such that the planarization stop layer is exposed;
    recessing the trench fill insulating material to under the planarization stop film; and
    forming a trench oxidation-preventive film on the recessed trench fill insulating material.

2. The method of claim 1, further comprising planarizing the oxidation-preventive to a level that is substantially even with an upper surface of the planarization stop film.

3. The method of claim 1, wherein the planarization stop film is made of a silicon layer, and the trench oxidation-preventive film is made of a silicon nitride film.

4. A method for forming a trench isolation comprising the steps of:
    forming a planarization stop film on a semiconductor substrate on which a pad oxide film is formed;
    forming a trench by etching sequentially a part of the planarization stop film, a part of the pad oxidation film, and a part of the semiconductor substrate;
    forming a thermal oxide film on a bottom and a sidewall of the trench, and on a sidewall and a top surface of the planarization stop film;
    filling the trench with a trench fill insulating material on the thermal oxide film to completely fill the trench;
    planarization the trench fill insulating material such that the planarization stop film is exposed;
    recessing the planarized trench fill insulating material under the planarization stop film;
    forming a trench oxidation-preventive film on the recessed trench fill insulating material; and
    removing the planarization stop film and the pad oxide film.

5. The method of claim 4, wherein the planarization stop film is made of a silicon film.

6. The method of claim 4, wherein the trench oxidation-preventive film is made of a silicon nitride film.

7. The method of claim 4, wherein the step of filling the trench is performed in a same facility for the step of the forming the thermal oxide film.

8. The method of claim 4, wherein the step of recessing the planarized trench fill insulating material exposes a sidewall of the planarization stop film, and recesses substantially to an interface between the planarization stop film and the pad oxidation film.

9. The method of claim 4, wherein the step of forming the oxidation-preventive film comprises the steps of:
    forming an oxidation-preventive material film on the planarization stop film and the recessed trench fill insulating material; and
    planarizing the oxidation-preventive material film such that the planarization stop film is exposed.

10. The method of claim 9, the method further comprising a step of forming a buffer oxidation film on the oxidation-preventive material film.

11. The method of claim 4, the method further comprising the steps of:
    forming a gate oxidation film on the semiconductor substrate on which the planarization stop film and the pad oxide film are removed;
    forming a gate electrode material on the gate oxidation film and the trench oxidation-preventive film;
    forming a gate line extending to one direction by patterning the gate electrode material;
    forming a sidewall spacer insulating film over an entire surface of the consequence where the gate line is formed; and
    forming an insulating spacer on a sidewall of the gate line by etching the sidewall spacer insulating film,
    wherein the trench oxidation-preventive film on both sides of the gate line is etched concurrently with the sidewall spacer insulating film, leaving the oxidation-preventive film only on the trench under the gate line and the sidewall spacer insulating film.

12. The method of claim 4, wherein the thermal oxidation film is formed on the sidewall and the top surface of the planarization stop film thicker than that on the bottom and the sidewall of the trench.

13. A method for forming a trench isolation comprising the steps of:
    forming a planarization stop layer on a semiconductor substrate on which a pad oxide layer is formed;
    forming a trench in the semiconductor substrate by etching sequentially a part of the planarization stop layer, a part of the pad oxide film, and a part of the semiconductor substrate;
    performing a thermal oxidation process for the semiconductor substrate in which the trench is formed;
    filling the trench with a trench fill insulating material in which the thermal oxidation process is performed;
    planarizing the trench fill insulating material such that the planarization stop layer is exposed;
    recessing the trench fill insulating material to a level substantially even with an upper surface of the pad oxide layer; and forming a trench oxidation-preventive film on the recessed trench fill insulating material.

14. The method of claim 13, further comprising planarizing the trench oxidation-preventive film to a level that is substantially even with an upper surface of the planarization stop film.

15. The method of claim 13, wherein the planarization stop film is made of a silicon layer, and the trench oxidation-preventive film is made of a silicon nitride film.

* * * * *